United States Patent
Maity et al.

(10) Patent No.: US 10,042,666 B2
(45) Date of Patent: Aug. 7, 2018

(54) PLATFORM SIMULATION FOR MANAGEMENT CONTROLLER DEVELOPMENT ON VIRTUAL MACHINES

(71) Applicant: American Megatrends, Inc., Norcross, GA (US)

(72) Inventors: Sanjoy Maity, Snellville, GA (US); Samvinesh Christopher, Suwanee, GA (US); Satheesh Thomas, Dunwoody, GA (US)

(73) Assignee: AMERICAN MEGATRENDS, INC., Norcross, GA (US)

( * ) Notice: Subject to any disclaimer, the term of this patent is extended or adjusted under 35 U.S.C. 154(b) by 115 days.

(21) Appl. No.: 15/233,073

(22) Filed: Aug. 10, 2016

(65) Prior Publication Data
US 2018/0046485 A1 Feb. 15, 2018

(51) Int. Cl.
G06F 9/455 (2018.01)
G06F 9/44 (2018.01)
G06F 17/50 (2006.01)
G06F 9/4401 (2018.01)

(52) U.S. Cl.
CPC ........ G06F 9/45558 (2013.01); G06F 9/4403 (2013.01); G06F 17/5009 (2013.01); *G06F 2009/45579* (2013.01)

(58) Field of Classification Search
None
See application file for complete search history.

(56) References Cited

U.S. PATENT DOCUMENTS

| | | | |
|---|---|---|---|
| 9,384,018 B2 * | 7/2016 | Du | H04L 43/0817 |
| 9,436,491 B1 * | 9/2016 | Chiou | G06F 9/45545 |
| 2015/0160960 A1 * | 6/2015 | Delco | G06F 9/45545 718/1 |

* cited by examiner

*Primary Examiner* — Bing Zhao
(74) *Attorney, Agent, or Firm* — Locke Lord LLP; Tim Tingkang Xia, Esq.

(57) ABSTRACT

Certain aspects direct to systems and methods for platform simulation on virtual machine for development projects of a management controller on virtual machines. At least one virtual machine (VM) is provided to simulate a management controller and a host computing device for the management controller. The at least one VM includes: a firmware module for the management controller, configured to receive at least one output signal from the host computing device or from at least one device connected to the host computing device; and a simulator module configured to simulate the host computing device or the at least one device connected to the host computing device. In operation, the simulator module generates the at least one output signal based on configuration data of the host computing device or the device connected to the host computing device, and sends the at least one output signal to the firmware module.

14 Claims, 5 Drawing Sheets

PLATFORM SIMULATION FOR MANAGEMENT CONTROLLER DEVELOPMENT ON VIRTUAL MACHINES

FIELD

The present disclosure relates generally to virtual machine (VM) and management controller technologies, and more particularly to systems and methods for platform simulation for management controller development on virtual machines.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Baseboard management controller (BMC) development projects have dependency on hardware. However, the cost of pre-production hardware can be very high, and BMC developers have to share available machines.

Therefore, an unaddressed need exists in the art to address the aforementioned deficiencies and inadequacies.

SUMMARY

Certain aspects of the present disclosure relate to a system, which includes a computing device. The computing device includes a processor and a storage device storing computer executable code, where the computer executable code, when executed at the processor, is configured to: provide at least one virtual machine (VM), the at least one VM being configured to simulate a management controller and a host computing device for the management controller. The at least one VM includes: a firmware module for the management controller, configured to receive at least one output signal from the host computing device or from at least one device connected to the host computing device; and a simulator module configured to simulate the host computing device or the at least one device connected to the host computing device by: generating the at least one output signal based on configuration data of the host computing device or the device connected to the host computing device; and sending the at least one output signal to the firmware module.

In certain embodiments, the computer executable code includes: a hypervisor configured to execute at the processor of the computing device to provide a first domain; and the at least one VM, configured to be executed in the first domain to simulate the management controller and the host computing device.

In certain embodiments, the at least one VM includes: a first VM configured to simulate the management controller, including the firmware module; and a second VM configured to simulate the host computing device. In certain embodiments, the simulator module includes: a controller simulator module located on the first VM; and a host simulator module located on the second VM.

In certain embodiments, the host simulator module includes: a basic input/output system (BIOS) simulation module, configured to simulate a BIOS of the host computing device; and an interface simulation module, configured to simulate a plurality of interfaces of the host computing device.

In certain embodiments, the interfaces simulated by the interface simulation module include an Enhanced Host Controller Interface (EHCI) interface and a Low Pin Count (LPC) interface.

In certain embodiments, the firmware module includes a library module storing a plurality of library programs for the host computing device and the at least one device connected to the host computing device.

In certain embodiments, the controller simulator module includes: a data store storing the configuration data of the host computing device or the device connected to the host computing device; and at least one simulator library submodule, each configured to simulate one of the at least one device by: receiving a command from one of the library programs of the library module; generating the at least one output signal as a response to the command for the at least one device based on the configuration data stored in the data store; and sending the response to the library module.

In certain embodiments, the controller simulator module further includes: at least one simulator driver sub-module, each configured to simulate one of the at least one device controlled by a driver by: receiving a command from the driver; generating the at least one output signal as a response to the command for the at least one device based on the configuration data stored in the data library; and sending the response to the driver.

In certain embodiments, the configuration data includes: platform data for the host computing device; device data for the at least one device connected to the host computing device; and device specific configuration parameters for the at least one device connected to the host computing device.

In certain embodiments, each of the device specific configuration parameters is a static value, a random value within a range, a value obtained from one or more patterns, a value derived from a function of another set of variables, a value set by an administrator, a time-based value, or a value picked from a socket server.

In certain embodiments, the at least one device connected to the host computing device includes: a voltage sensor; a computer tachometer sensor; an Inter-Integrated Circuit (I2C) device; a power supply unit (PSU); a complex programmable logic device (CPLD); a field-replaceable unit (FRU); a Redundant Array of Independent Disks (RAID) controller; a RAID-on-chip (ROC); a network interface card (NIC); a satellite management controller; an interface connected to the satellite management controller; a system interface; a universal serial bus (USB) interface; and a Host Embedded Controller Interface (HECI).

Certain aspects of the present disclosure relate to a method for platform simulation for development projects of a management controller. In certain embodiments, the method includes: providing, at a computing device, at least one virtual machine (VM), the at least one VM being configured to simulate a management controller and a host computing device for the management controller, wherein the at least one VM includes: a firmware module for the management controller, configured to receive at least one output signal from the host computing device or from at least one device connected to the host computing device; and a simulator module configured to simulate the host computing device or the at least one device connected to the host computing device; generating, by the executing simulator module, the at least one output signal based on configuration data of the host computing device or the device connected to the host computing device; and sending, by the executing simulator module, the at least one output signal to the firmware module.

In certain embodiments, the method further includes: executing, at the computing device, a hypervisor, wherein the hypervisor is configured to provide a first domain; and executing the at least one VM in the first domain to simulate the management controller and the host computing device.

In certain embodiments, the at least one VM includes: a first VM configured to simulate the management controller, including the firmware module; and a second VM configured to simulate the host computing device. In certain embodiments, the simulator module includes: a controller simulator module located on the first VM; and a host simulator module located on the second VM.

In certain embodiments, the host simulator module includes: a basic input/output system (BIOS) simulation module, configured to simulate a BIOS of the host computing device; and an interface simulation module, configured to simulate a plurality of interfaces of the host computing device. In certain embodiments, the interfaces simulated by the interface simulation module include an Enhanced Host Controller Interface (EHCI) interface and a Low Pin Count (LPC) interface.

In certain embodiments, the firmware module includes a library module storing a plurality of library programs for the host computing device and the at least one device connected to the host computing device. In certain embodiments, the controller simulator module includes: a data store storing the configuration data of the host computing device or the device connected to the host computing device; and at least one simulator library sub-module, each configured to simulate one of the at least one device by: receiving a command from one of the library programs of the library module; generating the at least one output signal as a response to the command for the at least one device based on the configuration data stored in the data store; and sending the response to the library module.

In certain embodiments, the controller simulator module further includes: at least one simulator driver sub-module, each configured to simulate one of the at least one device controlled by a driver by: receiving a command from the driver; generating the at least one output signal as a response to the command for the at least one device based on the configuration data stored in the data library; and sending the response to the driver.

Certain aspects of the present disclosure relate to a non-transitory computer readable medium storing computer executable code. The computer executable code, when executed at a processor of a computing device, is configured to: provide at least one virtual machine (VM), the at least one VM being configured to simulate a management controller and a host computing device for the management controller, wherein the at least one VM comprises: a firmware module for the management controller, configured to receive at least one output signal from the host computing device or from at least one device connected to the host computing device; and a simulator module configured to simulate the host computing device or the at least one device connected to the host computing device by: generating the at least one output signal based on configuration data of the host computing device or the device connected to the host computing device; and sending the at least one output signal to the firmware module.

These and other aspects of the present disclosure will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, wherein.

DETAILED DESCRIPTION

Figure 1:
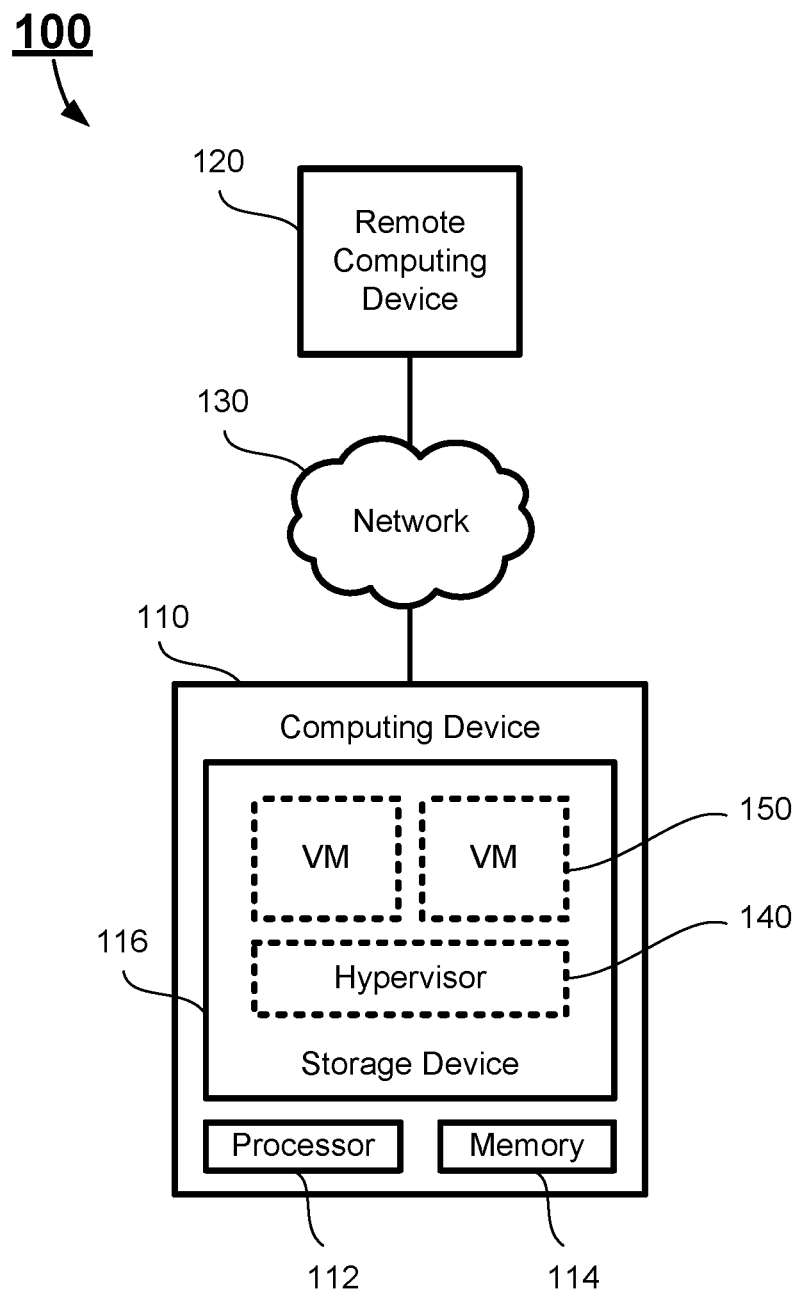
FIG. 1 schematically depicts an exemplary system according to certain embodiments of the present disclosure.

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "plurality" means two or more.

As used herein, the terms "comprising," "including," "carrying," "having," "containing," "involving," and the like are to be understood to be open-ended, i.e., to mean including but not limited to.

As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term "module" may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

As used herein, the term "server" generally refers to a system that responds to requests across a computer network to provide, or help to provide, a network service. An implementation of the server may include software and suitable computer hardware. A server may run on a computing device or a network computer. In some cases, a computer may provide several services and have multiple servers running.

As used herein, the term "hypervisor" generally refers to a piece of computer software, firmware or hardware that creates and runs virtual machines. The hypervisor is sometimes referred to as a virtual machine manager (VMM).

The term "code", as used herein, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The term "interface", as used herein, generally refers to a communication tool or means at a point of interaction between components for performing data communication between the components. Generally, an interface may be applicable at the level of both hardware and software, and may be uni-directional or bi-directional interface. Examples of physical hardware interface may include electrical connectors, buses, ports, cables, terminals, and other I/O devices or components. The components in communication with the interface may be, for example, multiple components or peripheral devices of a computer system.

The terms "chip" or "computer chip", as used herein, generally refer to a hardware electronic component, and may refer to or include a small electronic circuit unit, also known as an integrated circuit (IC), or a combination of electronic circuits or ICs.

The present disclosure relates to computer systems applied to simulate management controller, such as BMC, and host computing device which the management controller communicates with and operates on. As depicted in the drawings, computer components may include physical hardware components, which are shown as solid line blocks, and virtual software components, which are shown as dashed line blocks. One of ordinary skill in the art would appreciate that, unless otherwise indicated, these computer components may be implemented in, but not limited to, the forms of software, firmware or hardware components, or a combination thereof.

The apparatuses, systems and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Certain aspects of the present disclosure direct to systems and methods for platform simulation for management controller development on virtual machines. As discussed above, BMC development projects have dependency on hardware. For example, there are two distinct hardware dependencies for the BMC development projects: (a) a system on a chip (SOC) where the BMC code has to run; and (b) platform specific devices with which the BMC communicates, such as a voltage sensor, a "tach" (i.e., a computer tachometer), a Redundant Array of Independent Disks (RAID) controller, a network interface card (NIC), a satellite management controller, a complex programmable logic device (CPLD), a power supply unit (PSU), or other hardware components or devices manageable by the BMC. However, the cost of pre-production hardware can be very high, and BMC developers have to share available hardware components or machines to perform the development projects. Therefore, the systems and methods for platform simulation for management controller development on virtual machines can provide a cost effective solution.

FIG. 1 schematically depicts an exemplary system according to certain embodiments of the present disclosure. As shown in FIG. 1, the system 100 includes a computing device 110, which is specifically configured to provide a plurality of virtual machines, such that platform simulation for one or more management controllers may be performed on the virtual machines provided by the computing device 110. Optionally, the system 100 may further include a remote computing device 120, which is communicatively connected to the computing device 110 via a network 130, such that an administrator may remotely control the computing device 110 through the remote computing device 120. For example, the remote computing device 120 may allow an administrator/user to input data as part of the simulated data of the simulated devices and/or the simulated platforms to the computing device 110. In certain embodiments, the network 130 may be a wired or wireless network, and may be of various forms. Examples of the network 130 may include, but is not limited to, a local area network (LAN), a wide area network (WAN) including the Internet, or any other type of networks.

The computing device 110 is a specialized device configured to simulate one or more management controllers and the one or more platform hardware devices being managed by the management controllers using the virtual machines. In certain embodiments, the computing device 110 may be a virtual machine server for providing a plurality of virtual machines. In certain embodiments, the computing device 110 may simulate, on one or more virtual machines being provided, a management controller, as well as a host computing device where the management controller typically is hosted on and communicates with. The management controller being simulated may be for any purposes, such as baseboard management, chassis management, rack management or any other types of management purposes. In certain embodiments, the VMs running on the computing device 110 may simulate parameters typically received by the management controller from the host computing device, such as temperature, cooling fan speeds, power status, operating system (OS) status, Basic Input/Output System (BIOS) status, and interface status including Low Pin Count (LPC) and Enhanced Host Controller Interface (EHCI) settings, etc. In certain embodiments, the VMs running on the computing device 110 may monitor the parameters and send alerts to a system administrator at the remote computing device 120 via the network 130 if any of the parameters do not stay within preset limits, indicating a potential failure of the system. The administrator may also remotely communicate with the VMs running on the computing device 110 from the remote computing device 120 to take some corrective action to the simulated system, such as resetting or power cycling the system to get a hung operating system (OS) running again. Examples of the features that the computing device 110 may monitor include: sensor monitoring, firmware update of the PSU, the CPLD, or other out-of-band (OOB) devices, protocols such as Management Component Transport Protocol (MCTP), interfacing with satellite management controllers or other devices behind the satellite management controllers, interface channels such as the keyboard controller style (KCS) interface or other system interfaces, the universal serial bus (USB) interface and the Host Embedded Controller Interface (HECI), integrated behavior such as PSU power based on specific component composition and system load, kernel and uboot. Further, other features of the computing device 110 may include: system event log (SEL), platform event filtering (PEF), boundary conditions, invalid values from the devices, unexpected size of data from the devices, delays from the devices, and unexpected restart of the devices, losing the state of the machines in transactions.

As shown in FIG. 1, the computing device 110 includes a processor 112, a memory 114, and a storage device 116. Further, the computing device 110 may include other hardware components and software components (not shown) to perform its corresponding tasks. For example, the computing device 110 may include a network interface, such as a network interface card (NIC), which is used to connect the computing device 110 to the network 130. Other examples of these hardware and software components of the management controller 110 may include, but not limited to, other required memory, interfaces, buses, Input/Output (I/O) modules and peripheral devices.

The processor 112 is configured to control operation of the computing device 110. In certain embodiments, the processor 112 may be a central processing unit (CPU). The processor 112 can execute any computer executable code or instructions, such as the hypervisor 140 and the virtual machines 150, or other applications and instructions of the computing device 110. In certain embodiments, the computing device 110 may run on more than one processor, such as two processors, four processors, eight processors, or any suitable number of processors.

The memory 114 can be a volatile memory, such as the random-access memory (RAM), for storing the data and information during the operation of the computing device 110. In certain embodiments, the memory 114 may be a volatile memory array. In certain embodiments, the computing device 110 may run on more than one memory 114.

The storage device 116 is a non-volatile data storage media for storing computer executable code or instructions for performing the operation of the computing device 110. In certain embodiments, the computer executable code or instructions of the computing device 110 may be implemented as one or more application programs or modules. Examples of the storage device 116 may include non-volatile memory such as flash memory, memory cards, USB drives, hard drives, floppy disks, optical drives, or any other types of data storage devices. In certain embodiments, the computing device 110 may have multiple storage devices 116, which may be identical storage devices or different types of storage devices. The VMs, hypervisor, or other applications of the computing device 110 may be stored in one or more of the storage devices 116 of the computing device 110.

As shown in FIG. 1, the applications stored in the storage device 116 include a hypervisor 140 and a plurality of VMs 150. As discussed above, each of the hypervisor 140 and the VMs 150 may be formed by the computer executable code or instructions executable at the processor 112. In certain embodiments, each of the hypervisor 140 and the VMs 150 may further include sub-modules. Alternatively, in certain embodiments, the hypervisor 140 and the VMs 150 may be combined to form a single module. In certain embodiments, the storage device 116 may store other applications independent from the hypervisor 140 and the VMs 150.

The hypervisor 140 is a program that allows multiple VM instances to run simultaneously and share a single hardware host, such as the computing device 110. The hypervisor 140, when executed at the processor 112, implements hardware virtualization techniques and allows one or more simulated management controller and host computing device or other applications to run concurrently on one or more virtual machines on the computing device 110. For example, a plurality of users through the remote computing device may attempt to simulate management controllers or a host computing device which a management controller typically is hosted on and communicates with. The hypervisor 140 allows each user to run a microcontroller instance or a host server instance as a VM. In certain embodiments, the hypervisor 200 can be of various types and designs, such as MICROSOFT HYPER-V, XEN, VMWARE ESX, or other types of hypervisors suitable for the system 100.

The VMs 150 are configured to provide simulation of management controllers and host computing devices the management controllers typically are hosted on and communicate with. Each of the VMs 150, when running on the hypervisor as a VM instance, allow an administrator to perform microcontroller test and development thereon. In certain embodiments, the VMs 150 serve as an effective and efficient replacement for SOC evaluation boards, particularly under the situation when the SOC evaluation boards are short in supply or there have been changes to the SOC with older platforms. Indeed, developers often find it difficult to reproduce issues reported by a test team or customers because of difference in the hardware configuration, and with the VMs 150, it is easy to produce a copy of the desired configuration, as the VMs 150 can easily make all the configurations being identical. Further, as the VMs 150 can be freely created by an administrator, the number of the VMs 150 can be set to be enormous, and the number of target management controllers for development and testing is no more constrained compared to traditional physical SOC evaluation boards. In certain embodiments, an administrator may run as many VMs 150 as he or she desires at the same time, with each VM simulating a different version of an management controller, so that the administrator can compare behavior between the different versions of the management controller to check on BMC development issues. In certain embodiments, multiple testing can be parallel performed by administrators on a plurality of VMs 150, with each VM 150 simulating the same version of the management controller. For example, a tester can run automated scripts on one VM 150 while testing web UI on another VM 150 simultaneously. The parallel testing on the VMs 150 aids in reducing the duration of testing cycles and achieves faster time to market.

Figure 2:
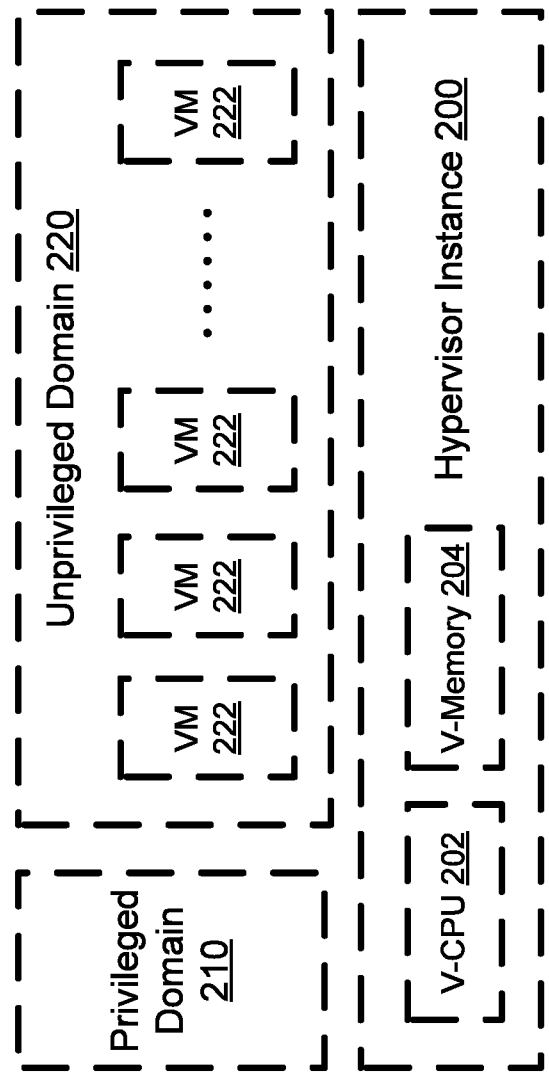
FIG. 2 schematically depicts the execution of the VMs on the system according to certain embodiments of the present disclosure.

FIG. 2 schematically depicts the execution of the VMs on the system according to certain embodiments of the present disclosure. As shown in FIG. 2, when the hypervisor instance 200 runs on the computing device 110, the hypervisor 200 emulates a virtual computer machine, including a virtual CPU 202 and a virtual memory 204. The hypervisor instance 200 provides the virtual CPU 202 and the virtual memory 204 to the virtual machines 222 or guests operating on top of the hypervisor 200. The hypervisor 200 also emulates a plurality of domains, including a privileged domain 210 and an unprivileged domain 220 for the VMs. A plurality of VM instances 222 can run in the unprivileged domain 220 of the hypervisor 200 as if they are running directly on a physical computer.

In certain embodiments, one or more VM instances 222 may be used to simulate the management controller and the host computing device. For example, at least one VM instance 222 in the unprivileged domain may be a management controller simulating VM, which simulates a management controller, and at least one VM instance 222 may be a host computing device simulating VM, which simulates a host computing device which the management controller typically is hosted on and communicates with. More than one developer/tester can use the same management controller simulating VM or the host computing device simulating VM. Alternately, a developer/tester can parallel use different management controller simulating VMs or the host computing device simulating VMs. The management controller simulating VMs and the host computing device simulating VMs can communicate with each other through a host integration module which is provided either in a management controller simulating VM or a host computing device simulating VM. The communication between the management controller simulating VMs and the host computing device simulating VMs allows a simulated management controller to be further developed for operating environment accommodation in a host computing device, such as BIOS development and platform validation for a simulated management controller in a VM, which enables, for example, early integration of BIOS and BMC.

Figure 3A:
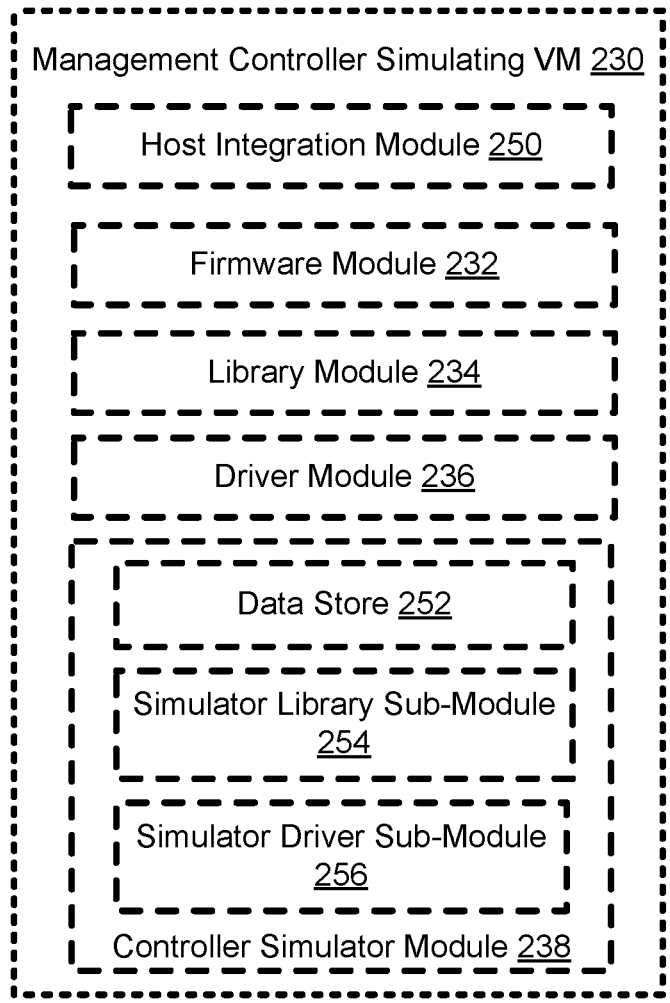
FIG. 3A depicts a management controller simulating VM of the system according to certain embodiments of the present disclosure.
Figure 3B:
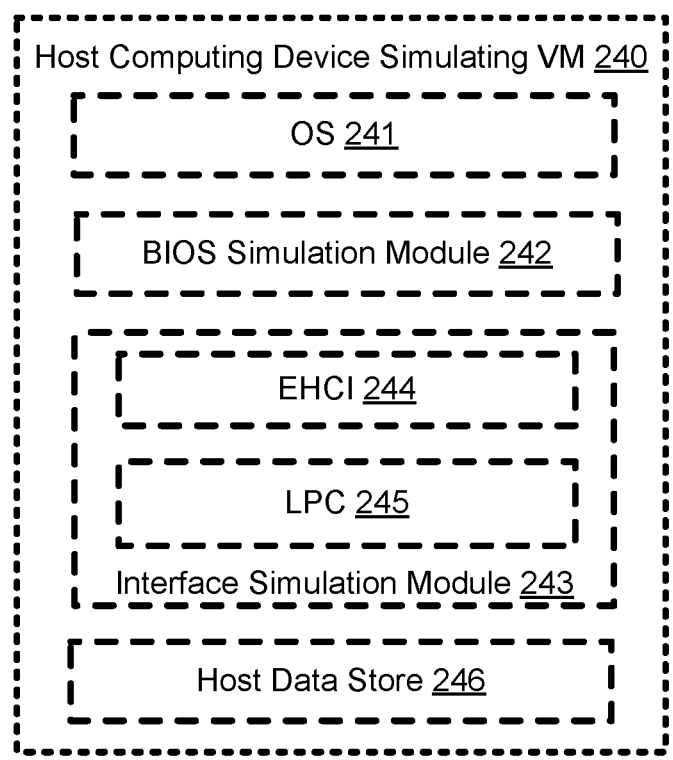
FIG. 3B depicts a host computing device simulating VM of the system according to certain embodiments of the present disclosure.

FIG. 3A depicts a management controller simulating VM of the system according to certain embodiments of the present disclosure. FIG. 3B depicts a host computing device simulating VM of the system according to certain embodiments of the present disclosure. Specifically, the management controller simulating VM 230 and the host computing device simulating VM 240 are coexisting VM instances to simulate the management controller and the host computing device. In certain embodiments, the management controller simulating VM 230 may simulate certain different devices with which a management controller typically interacts, including the devices not usually provided by a host computing device to a management controller, such as PSU. The host computing device simulating VM 240 may simulate certain core operation environment features/components provided typically by a host computing device to a management controller, such as the BIOS and other core features. However, the simulation of any of the devices, components, or features is not bound specifically to the two VM instances, including the management controller simulating VM 230 and the host computing device simulating VM 240. For example, the BIOS simulation can be provided by a simulator module located in the management controller simulating VM 230, while the PSU simulation can be provided by the host computing device simulating VM 240. In other words, the simulation of the components and features of a host computing device and the devices connected to the host computing device can be performed collectively by one or more VM instances, including the management controller simulating VM 230 and the host computing device simulating VM 240, with a part of the device/feature simulation being performed by one of the VM instances 230 and 240, and the rest of the device/feature simulation being performed by the other one of the VM instances 230 and 240, so as to achieve integration of management controller with host computing devices settings.

As shown in FIG. 3A, the management controller simulating VM 230 includes a management controller image, and simulates certain different devices with which a management controller is typically interacting using software modules. The management controller image of the management controller simulating VM 230 includes, without being limited thereto, a firmware module 232, a library module 234, a driver module 236, and a controller simulator module 238. It should be noted that some of the devices, such as I2C, can be simulated at the driver level, and therefore do not need to be emulated. In certain embodiments, only the minimal registers and/or devices needed by kernel are needed to be emulated. Further, as described above, the management controller simulating VM 230 may include a host integration module 250 to communicate with host computing device simulating VM 240 for integration purpose. Each of the firmware module 232, the library module 234, the driver module 236, the controller simulator module 238, and the host integration module 231 may be formed by the computer executable code or instructions. In certain embodiments, each of the modules may further include sub-modules. Alternatively, in certain embodiments, some or all of the modules may be combined to form a single module. In certain embodiments, the management controller simulating VM 230 may include other applications independent from the modules.

The host integration module 250 is configured to perform interfacing between the management controller simulating VM 230 and the host computing device simulating VM 240. The host integration module 250 may be implemented through a socket based approach, which may be extended for local or remote communication. Alternately, the host integration module may be implemented through an API based library. The exchange means through the host integration module 250 between the management controller simulating VM 230 and the host computing device simulating VM 240 may include Low Pin Count (LPC) bus, Enhanced Serial Peripheral Interface (eSPI), USB, General-purpose input/output (GPIO), Intelligent Platform Management Bus (IPMB), Video interfaces, and so on. The host integration module 250 may be provided in either only the management controller simulating VM 230 or only in the host computing device simulating VM 240. In certain embodiments, the host integration module 250 may be provided in the host computing device simulating VM 240 rather than the management controller simulating VM 230.

The firmware module 232 provides the firmware of the management controller simulated by the management controller simulating VM 230. In certain embodiments, the firmware module 232 may include a plurality of modules or sub-modules, which may respectively be implemented by computer executable codes or instructions to collectively form the firmware module 232. In certain embodiments, the firmware module 232 may include applications for monitoring the various features of devices a management controller is supposed to be connected to. Examples of the features of the devices may include, without being limited to, sensors, firmware updates, satellite control monitoring, bridging, interfacing, RAID management, device management, field-replaceable unit (FRU) commands, or any other features that may be managed or monitored by a management controller. In operation, the firmware module 232 may receive the corresponding data from the controller simulator module 238. In certain embodiments, different firmware modules or sub-modules of the firmware module 232 may respectively receive the corresponding data simultaneously. In certain embodiments, the firmware module 232 may further generate test result based on the data received, and send the test result back to the simulator module 238. In certain embodiments, the firmware module 232 may include other applications necessary for the operation of the simulated management controller.

The library module 234 is a module storing a plurality of library programs used for development purposes. In certain embodiments, the library programs of the library module 234 may include configuration information of the simulated management controller, documentation, help data, message templates, pre-written code and subroutines, classes, values or type specifications, or any other data necessary for the development projects. Each of the library programs of the library module 234 may correspond to one or more actions for communicating with the features, such as hardware or software components, being monitored by the simulated management controller. For example, some of the library programs of the library module 234 may be in charge of the read/write process to certain features or devices. In certain embodiments, the library programs of the library module 234 may be a part of the firmware module 232, or may be separate from the firmware module 232. It should be noted that, although FIG. 3A shows the library module 234 as a collective module of the library programs, each library program may be independent and separate from one another, and may be stored in different locations and executed independently in different threads.

The driver module 236 is a module storing a plurality of drivers. In certain embodiments, the drivers may be a part of the firmware module 232, or may be separate from the firmware module 232. Each of the drivers of the driver module 236 may correspond to one of the features, such as hardware or software components, being monitored by the simulated management controller of the management controller simulating VM 230. It should be noted that, although FIG. 3A shows the driver module 236 as a collective module of the drivers, each driver may be independent and separate from one another. In operation, the drivers are configured to control the corresponding feature, and to receive and process data from the corresponding feature.

The controller simulator module 238 is configured to simulate the features and devices supposedly being communicating to and monitored by the simulated management controller and the platforms used by the devices to communicate with the simulated management controller. In certain embodiments, the controller simulator module 238 of the management controller simulating VM 230 may include a plurality of sub-modules, such as a data store 252, a simulator library sub-module 254, and a simulator driver sub-module 256. As discussed above, the simulated management controller may monitor and manage certain features and/or devices it communicates with. For example, the features and/or devices being monitored and managed by the simulated management controller may include computer platforms and the devices and features of the computer platforms. In the management controller development projects, there may be required tests to be performed for each of different platforms, different devices, and different device specific configuration parameters for each device. Generally, in the management controller development projects, the SOC vendors may provide development boards (also referred to as the evaluation boards or "eval boards"), which may be used in a laboratory environment to perform development and testing purposes. In some cases, older computer platforms may be available as needed and used for new development. However, the dependency on the hardware components may be about the board/platform specific features. For example, the voltage sensors, tach sensors, and some of the Inter-Integrated Circuit (I2C) devices may be simple hardware components that provide value on the I2C buses. Some of the I2C devices, such as other management controllers, PSU devices on PMBUS, the I2C interface for the RAID cards or the network cards, may perform command processing. In certain embodiments, these features and devices to be tested may be simulated by the controller simulator module 238.

In certain embodiments, the controller simulator module 238 may include one or more simulation files, which contains the detailed information of the features and devices being simulated. In certain embodiments, the simulation files may include, without being limited to: (1) one or more platform data files, each providing the detailed information of the type of the platform device and an address; (2) one or more device data files (which may be used across projects for different platforms), each providing the detailed information of the type of the device and the types of commands and responses of the device; and (3) one or more device specific configuration parameter files, each providing the specific configuration applicable for the device, including the method of generating the response.

In certain embodiments, the controller simulator module 238 may obtain data typically generated by the simulated features and/or devices, and send the data to the firmware module 232, so as to test and develop the simulated management controller without dependency on physical devices. In certain embodiments, the controller simulator module 238 may further receive the response from the firmware module 232, and then obtain further data to be sent to the firmware module 232 based on the response from the firmware module 232. In certain embodiments, the controller simulator module 238 may store platform data files providing platform details of the devices such as the type, the bus address and the device address of the devices, device data files correspondingly providing details of each device such as the type of command and responses of each device, and device specific configuration parameter files correspondingly providing specific configuration applicable for each of the devices, including the method of generating the response of each of the devices. The controller simulator module 238 may generate the simulated data based on the platform data files, device data files, and device specific configuration parameter files.

The data store 252 is a database which stores configuration data of the devices being simulated by the controller simulator module 238. In certain embodiments, the data store 252 may be modified to support the read/write processes by the library programs of the library module 234. In certain embodiments, the configuration data may include the platform data files, the device data files, and the device specific configuration parameter files. In certain embodiments, the device specific configuration parameter files may contain configuration parameters of the devices. In certain embodiments, the configuration parameters of the devices may include device values, and each of the device values may be a static value or a random value within a range. In certain embodiments, the device values may be obtained from patterns, or derived from a function of another set of variables. In certain embodiments, the device values may be values set by administrators/users through the remote computing device 120, time-based values based on different time of a day, or values picked from a socket server located locally in the computing device 110 or from a remote machine (which may be the remote computing device 120, or may be another remote computer not shown in the figures). For example, values of voltage sensor at the time of power on in a dynamic manner can be changed by an administrator/user through the remote computing device 120 to aid studying of the event generation and the need for the masking of the events in the initializing period.

The simulator library sub-module 254 is a sub-module to simulate the command and/or response of the devices. In certain embodiments, the simulation of the simulator library sub-module 254 is performed based on the configuration data stored in the data store 252. In certain embodiments, in response to an action or a command from the library module 234 that is supposed to be sent to certain devices, the simulator library sub-module 254 may simulate a corresponding response of the devices based on the corresponding platform data files, device data files, and device specific configuration parameter files for the devices stored in the data store 252. For example, the simulator library sub-module 254 may simulate application program interfaces (APIs) of a particular device, such as a read/write process, by referring to the device address (e.g., bus address and device address of the device on the bus) contained in the platform data files for the device, and simulate a response as needed by the device by referring to the configuration parameters of the device contained in the device specific configuration parameter files for the device. In response to generating the simulated data, the simulator library sub-module 254 sends the simulated data to the firmware module 232 through the library module 234 for management controller testing and developing. In certain embodiments, the simulator library sub-module 254 may simulate for intelligent devices such as satellite controllers, PSUs, NIC, RAID, CPLD by referring to the data store 252 or to the socket server. In certain embodiments, the simulator library sub-module 254 may simulate devices behind satellite controllers, which are accessed by bridging, by referring to the data store 252 for bridge command for the devices and execute the command. In certain embodiments, more than one simulator library sub-module 254 may co-exist to simulate the different intelligent devices.

The simulator driver sub-module 256 may simulate the command and/or response to/from the drivers of the driver module 236. As discussed above, the drivers of the driver module 236 are configured to receive and process data from the corresponding hardware, and send the processed data to the firmware module 232. In certain embodiments, the library programs of the library module 234 may use the drivers of the driver module 236 to interact with the corresponding hardware. In certain embodiments, the simulator driver sub-module 256 may simulate data from part or all of the hardware controlled by the drivers, and send the simulated data to the corresponding driver in the driver module 236 for processing. For example, the driver module 236 may include one or more existing drivers for a certain device. In this case, the simulator driver sub-module 256 may simulate a driver, which can register one or more handlers with the existing drivers for the device, and the existing drivers may check for registration to determine whether the drivers should be handled by the simulator driver sub-module 256 (i.e., the simulated driver). In certain embodiments, more than one simulator driver sub-module 256 may co-exist to simulate the different intelligent devices.

In certain embodiments, the management controller simulating VM 230 may further contain extension modules for emulation, so that SOC vendors can add emulation modules for new technology interfaces in the future, and make it available to BMC developers ahead of time, so as to save the effort and cost of evaluation boards. And therefore, by the time the SOC comes with new feature, developers will have the chance to make the stack ready, and the SOC vendors can benefit from early feedbacks.

In operation, each of the sub-modules of the controller simulator module 238 may be independently executed in different threads such that each of the sub-modules may independently simulate the corresponding feature. In certain embodiments, the library module 234 may be modified to support the read/write processes by the sub-modules of the controller simulator module 238. For example, for a specific I2C device on a bus X and address Y, the sub-module corresponding to the I2C device will be coded such that the read/write process to the I2C device will reference to the configuration data stored in the library module 234 that corresponds to the I2C device. Thus, in the simulating process, the sub-module will retrieve the configuration data, and then generate a response as needed for the simulated I2C device based on the configuration data.

As shown in FIG. 3B, the host computing device simulating VM 240 runs an image of the host computing device which supposedly hosts and communicates with at least one management controller, and simulates the operating environment of the host computing device. In certain embodiments, the image of the host computing device may include, without being limited thereto, an OS 241, a BIOS simulation module 242 and an interface simulation module 243. In certain embodiments, the BIOS simulation module 242 and interface simulation module 243 may collectively form a host simulator module (not shown in the figure). In this embodiment, the host computing device simulating VM 240 communicates with at least one management controller simulating VM 230 through a host integration module 250 provided in the management controller simulating VM 230, so that simulated management controllers can be integrated with each other, and early integration of, for example, BIOS and BMC can be realized. In certain embodiments, the host integration module 250 may be provided within the host computing device simulating VM 240 instead of the management controller simulating VM 230. Each of the OS 241, the BIOS simulation module 242 and the interface simulation module 243 may be formed by the computer executable code or instructions. In certain embodiments, each of the OS 241, the BIOS simulation module 242 and the interface simulation module 243 may further include sub-modules. Alternatively, in certain embodiments, the OS 241, the BIOS simulation module 242 and the interface simulation module 243 may be combined to form a single module. In certain embodiments, the host computing device simulating VM 240 may include other applications independent from the OS 241, the BIOS simulation module 242 and the interface simulation module 243.

The OS 241 includes a set of functional programs that control and manage operations of a host computing device being simulated by the host computing device simulating VM 240. In certain embodiments, the OS 241 may receive and manage the simulated signals from components of the simulated host computing device, including the BIOS and the interfaces. The OS 241 may not realize that it is running on virtual machine and may perceive that it is running on a physical machine. In certain embodiments, the OS 241 is operable to multitask, i.e., execute computing tasks in multiple threads, and thus may be any of the following: MICROSOFT CORPORATION's "WINDOWS 95," "WINDOWS CE," "WINDOWS 98," "WINDOWS 2000" or "WINDOWS NT", "WINDOWS Vista,", "WINDOWS 7," "WINDOWS 8," "WINDOWS 10" operating systems, IBM's OS/2 WARP, APPLE's MACINTOSH OSX operating system, LINUX, UNIX, etc.

The host data store 246 is a database which stores configuration data of the host computing device simulated by the host computing device simulating VM 240. In certain embodiments, the configuration data may include the parameters of components such the OS 241, the BIOS, and the interfaces. In certain embodiments, the configuration parameters of the components may include component values, and each of the component values may be a static value or a random value within a range. In certain embodiments, the component values may be obtained from patterns, or derived from a function of another set of variables. In certain embodiments, the device values may be values set by administrators/users through the remote computing device 120, time-based values based on different time of a day, or values picked from a socket server located locally in the computing device 110 or from a remote machine (which may be the remote computing device 120, or may be another remote computer not shown in the figures).

The BIOS simulation module 242 is configured to simulate BIOS settings and commands of the host computing device to perform the booting functions for the simulated host computing device. The simulated BIOS settings and commands can be communicated to a simulated management controller through the host integration module 231, so as to develop a simulated management controller under different or the same BIOS settings of a simulated host computing device. The BIOS simulation module 242 may simulate a set of storage devices (designated as "bootable data storage devices" or a "bootable devices") that the simulated host computing device is allowed to boot from. In certain embodiments, the BIOS simulation module 242 may simulate the starting up of a host computing device, and in response to the starting up, performs power-on self-test and simulates the initiation and identification results of hardware devices, such as CPU, memory and storage devices, display card, keyboard and mouse, and other hardware devices, based on the configuration data of the devices stored in the host data store 246. The BIOS simulation module 242 then boots the simulated host computing device, i.e., instruct a virtual CPU 204 to read and execute the OS 241 from the simulated bootable devices specified by the BIOS simulation module 242. In certain embodiments, the BIOS simulation module 242 attempts to load, i.e., instruct the virtual CPU 204 to read and execute, a boot loader software from a specified bootable device. The boot loader software then loads the OS 241 from that simulated bootable device. The virtual CPU 204 can execute the OS and run an instance of the OS 241. Accordingly, the control of the simulated host computing device is given to the OS 241. The values of the configuration data of the BIOS simulation module 242 can be configured by a user (e.g., the administrator), changed by the user through the remote computing device 120, and/or programmed to logically generate at run time.

The interface simulation module 243 is configured to simulate features of interfaces of a host computing device. In certain embodiments, the interface simulation module 243 may include an EHCI simulation module 244 simulating an EHCI interface, and a LPC simulation module 245 simulating a LPC interface for the host computing device. Each of the EHCI simulation module 244 and LPC simulation module 245 may be formed by the computer executable code or instructions executable at the processor 112. In certain embodiments, each of the EHCI simulation module 244 and LPC simulation module 245 may further include sub-modules. In certain embodiments, the host computing device simulating VM 240 may include other applications simulating other interfaces independent from EHCI simulation module 244 and LPC simulation module 245.

The EHCI simulation module 244 is configured to simulate EHCI signals for the host computing device simulating VM 240. The EHCI simulation module 244 allows the simulated host computing device to be compatible with and communicable through a high-speed controller standard applicable to USB 2.0. The simulated signals of an EHCI may be based on the configuration data corresponding to the simulated EHCI in the host data store 246. In certain embodiments, the values of parameters of the EHCI simulation module 244 included in the corresponding configuration data can be configured by a user (e.g., the administrator), changed by the user through the remote computing device 120, and/or programmed to logically generate at run time.

The LPC simulation module 245 is configured to simulate LPC signals for the host computing device simulating VM 240. The LPC simulation module 245 allows the simulated host computing device to be compatible with and communicable through a LPC bus, and therefore capable of connecting low-bandwidth devices to a processor. The simulated signals of an LPC bus may be based on the configuration data corresponding to the simulated LPC bus in the host data store 246. The simulated signals may include LCLK, LRESET#, LFRAME#, LAD[3:0], LDRQ#, SERIRQ, CLKRUN#, LPCPD#, LSMI#, etc. In certain embodiments, the values of the parameters of the LPC simulation module 245 included in the corresponding configuration data can be configured by a user (e.g., the administrator), changed by the user through the remote computing device 120, and/or programmed to logically generate at run time.

Figure 4:
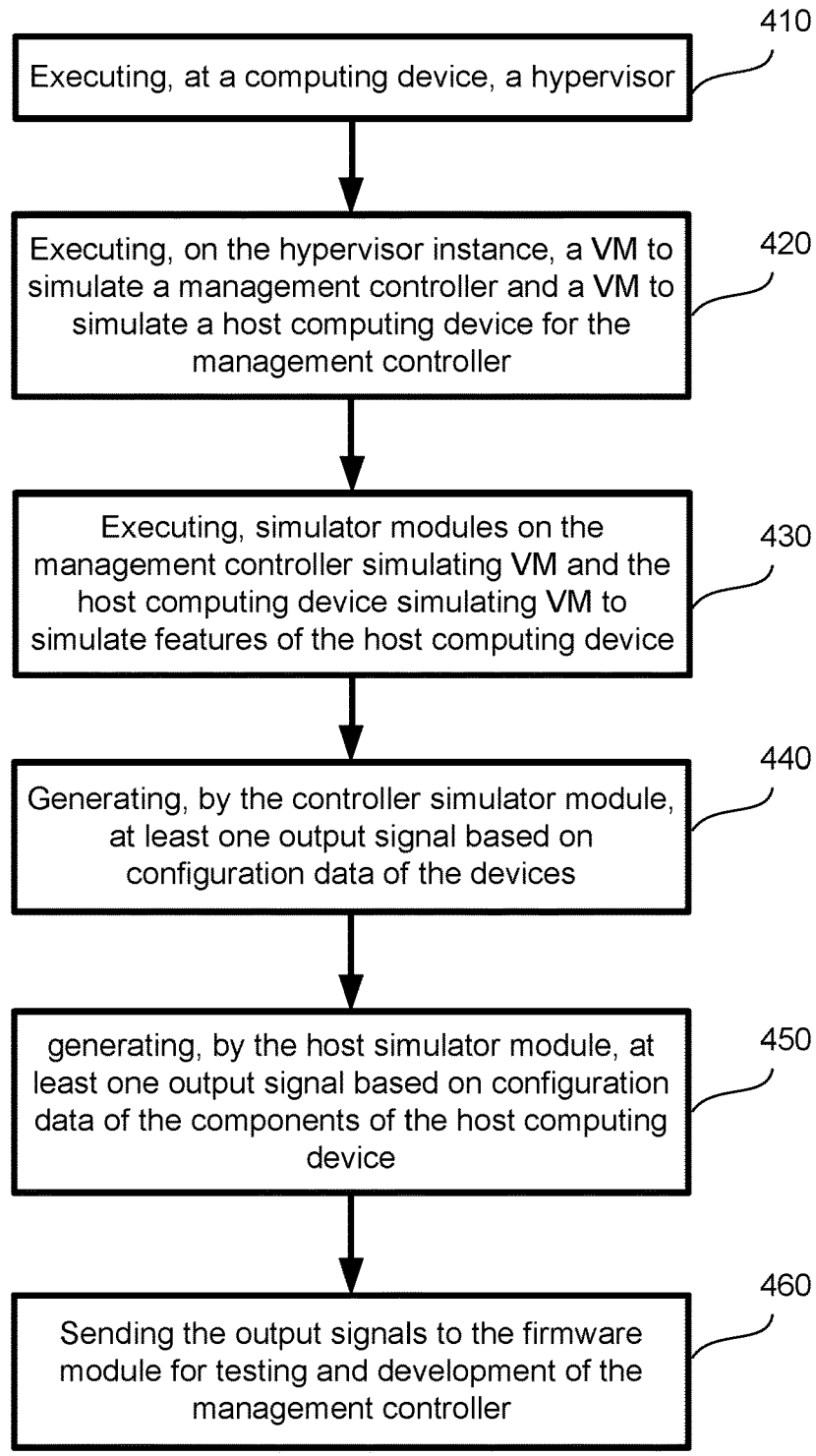
FIG. 4 depicts a flowchart showing a method for platform simulation for development projects of a simulated management controller on virtual machine according to certain embodiments of the present disclosure.

A further aspect of the present disclosure is directed to a method for platform simulation for development projects of a management controller on virtual machines. FIG. 4 depicts a flowchart showing a method for platform simulation for development projects of a management controller on virtual machines according to certain embodiments of the present disclosure. In certain embodiments, the method as shown in FIG. 4 may be implemented on a system as shown in FIG. 1. It should be particularly noted that the sequence of the procedures as described in the flowchart as shown in FIG. 4 may vary, and is thus not intended to limit the disclosure thereof.

As shown in FIG. 4, at procedure 410, a hypervisor is executed at the computing device 110. At procedure 420, a plurality of VM instances may be executed on the hypervisor instances, including the management controller simulating VM 230 to simulate a management controller, and the host computing device simulating VM 240 to simulate the host computing device for the management controller.

At procedure 430, the simulator modules may be executed on the management controller simulating VM 230 and the host computing device simulating VM 240 to simulate features of the host computing device. For the controller simulator module 238 on the management controller simulating VM 230, at procedure 440, the controller simulator module 238 generates at least one output signal based on the configuration data of the devices of the host computing device. As discussed above, the configuration data may be stored in the data store 252. In certain embodiments, the controller simulator module 238 may include one or more sub-modules to simulate one or more devices, and each of the sub-modules may be executed in a different thread such that the sub-modules may run simultaneously. Examples of the sub-modules may include the simulator library sub-module 254 and simulator driver sub-module 256. For the host simulator module (e.g., the BIOS simulation module 242 and/or the interface simulation module 243) on the host computing device simulating VM 240, at procedure 450, the host simulator module generates at least one output signal based on the configuration data of the components of the host computing device. Once the output signals are generated, at procedure 460, all of the output signals are sent to the firmware module 232 on the management controller simulating VM 230 for testing and development of the management controller. In certain embodiments, the firmware module 232 may send, through the library module 234 and/or the driver module 236, commands to the sub-modules of the controller simulator module 238, and each of the sub-modules of the controller simulator module 238 may return the output signal as the response to each of the commands back to the library module 234 and/or the driver module 236.

In a further aspect, the present disclosure is related to a non-transitory computer readable medium storing computer executable code. The code, when executed at one or more processor, may perform the method as described above. In certain embodiments, the non-transitory computer readable medium may include, but not limited to, any physical or virtual storage media. In certain embodiments, the non-transitory computer readable medium may be implemented as the storage device 116 of the computing device 110 as shown in FIG. 1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A system, comprising:
   a computing device, comprising a processor that executes computer executable code and a storage device storing the computer executable code, wherein the computer executable code comprises:
   a hypervisor configured to be executed at the processor of the computing device to provide a first domain;
   a first virtual machine (VM) comprising a firmware module for a simulated management controller and a controller simulator module; and
   a second VM comprising a host simulator module for a simulated host computing device;
   wherein the hypervisor, when executed at the processor, is configured to provide the first domain, allowing the first VM and the second VM to be executed simultaneously in the first domain as a first VM instance and a second VM instance, such that the first VM instance and the second VM instance share the computing device as a single hardware host;
   wherein the first VM, when executed at the processor as the first VM instance, is configured to:
     execute the firmware module to provide the simulated management controller, such that the simulated management controller is configured to receive at least one output signal from the simulated host computing device or from at least one simulated device connected to the simulated host computing device; and
     execute the controller simulator module to simulate features and devices communicating to and monitored by the simulated management controller;
   wherein the second VM, when executed at the processor as the second VM instance, is configured to:
     execute the host simulator module to provide the simulated host computing device or the at least one simulated device connected to the simulated host computing device;
     control the host simulator module to generate the at least one output signal based on configuration data of the simulated host computing device or the at least one simulated device connected to the simulated host computing device; and
     sending the at least one output signal to the firmware module executed at the first VM instance;
   wherein the controller simulator module comprises:
     a data store storing configuration data of the simulated host computing device and the at least one simulated device simulated by the controller simulator module; and
     at least one simulator library sub-module, wherein each of the at least one simulator library sub-module is configured to simulate one of the simulated devices simulated by the controller simulator module by:

generating at least one additional output signal for the simulated management controller for the simulated one of the at least one simulated device simulated by the controller simulator module based on the configuration data stored in the data store.

2. The system as claimed in claim 1, wherein the host simulator module comprises:
   a basic input/output system (BIOS) simulation module, configured to simulate a BIOS of the simulated host computing device; and
   an interface simulation module, configured to simulate a plurality of interfaces of the simulated host computing device.

3. The system as claimed in claim 2, wherein the interfaces simulated by the interface simulation module comprise an Enhanced Host Controller Interface (EHCI) interface and a Low Pin Count (LPC) interface.

4. The system as claimed in claim 1, wherein the firmware module comprises a library module storing a plurality of library programs for the simulated host computing device and the at least one simulated device connected to the simulated host computing device.

5. The system as claimed in claim 4, wherein each of the at least one simulator library sub-module is further configured to:
   receive a command from one of the library programs of the library module, wherein the at least one additional output signal is generated as a response to the command for the at least one simulated device based on the configuration data stored in the data store; and
   send the response to the library module.

6. The system as claimed in claim 5, wherein the controller simulator module further comprises:
   at least one simulator driver sub-module, each configured to simulate one of the at least one simulated device controlled by a driver by:
      receiving a command from the driver;
      generating the at least one output signal as a response to the command for the at least one simulated device based on the configuration data stored in the data library; and
      sending the response to the driver.

7. A method for platform simulation for development projects of a management controller, the method comprising:
   providing, at a computing device, a hypervisor, a first virtual machine (VM) and a second VM, wherein the hypervisor is configured to be executed at the computing device to provide a first domain, the first VM comprises a firmware module for a simulated management controller and a controller simulator module, and the second VM comprises a host simulator module for a simulated host computing device;
   executing the hypervisor at the computing device to provide the first domain;
   executing the first VM and the second VM simultaneously in the first domain as a first VM instance and a second VM instance, such that the first VM instance and the second VM instance share the computing device as a single hardware host;
   executing, by the first VM instance in the first domain, the firmware module to provide a simulated management controller;
   executing, by the first VM instance in the first domain, the controller simulator module to simulate features and devices communicating to and monitored by the simulated management controller;
   executing, by the second VM instance in the first domain, the host simulator module to provide the simulated host computing device or the at least one simulated device connected to the simulated host computing device;
   controlling, by the second VM instance in the first domain, the host simulator module to generate at least one output signal based on configuration data of the simulated host computing device or the simulated device connected to the simulated host computing device; and
   sending, by the second VM instance in the first domain, the at least one output signal to the firmware module executed at the first VM instance, such that the simulated management controller provided by the firmware module executed at the first VM instance is configured to receive the at least one output signal from the simulated host computing device or from the at least one simulated device connected to the simulated host computing device;
   wherein the controller simulator module comprises:
      a data store storing configuration data of the simulated host computing device and the at least one simulated device simulated by the controller simulator module; and
      at least one simulator library sub-module, wherein each of the at least one simulator library sub-module is configured to simulate one of the simulated devices simulated by the controller simulator module by:
   generating at least one additional output signal for the simulated management controller for the simulated one of the at least one simulated device simulated by the controller simulator module based on the configuration data stored in the data store.

8. The method as claimed in claim 7, wherein the host simulator module comprises:
   a basic input/output system (BIOS) simulation module, configured to simulate a BIOS of the simulated host computing device; and
   an interface simulation module, configured to simulate a plurality of interfaces of the simulated host computing device,
   wherein the interfaces simulated by the interface simulation module comprise an Enhanced Host Controller Interface (EHCI) interface and a Low Pin Count (LPC) interface.

9. The method as claimed in claim 7, wherein the firmware module comprises a library module storing a plurality of library programs for the simulated host computing device and the at least one simulated device connected to the simulated host computing device, and
   wherein each of the at least one simulator library sub-module is further configured to:
      receive a command from one of the library programs of the library module, wherein the at least one additional output signal is generated as a response to the command for the at least one simulated device based on the configuration data stored in the data store; and
      send the response to the library module.

10. The method as claimed in claim 9, wherein the controller simulator module further comprises:
    at least one simulator driver sub-module, each configured to simulate one of the at least one simulated device controlled by a driver by:

receiving a command from the driver;
generating the at least one output signal as a response to the command for the at least one simulated device based on the configuration data stored in the data library; and
sending the response to the driver.

11. A non-transitory computer readable medium storing computer executable code, wherein the computer executable code, when executed at a processor of a computing device, is configured to:
provide, at the computing device, a hypervisor, a first virtual machine (VM) and a second VM, wherein the hypervisor is configured to be executed at the computing device to provide a first domain, the first VM comprises a firmware module for a simulated management controller and a controller simulator module, and the second VM comprises a host simulator module for a simulated host computing device;
execute the hypervisor at the computing device to provide the first domain;
execute the first VM and the second VM simultaneously in the first domain as a first VM instance and a second VM instance, such that the first VM instance and the second VM instance share the computing device as a single hardware host;
execute, by the first VM instance in the first domain, the firmware module to provide a simulated management controller;
execute, by the first VM instance in the first domain, the controller simulator module to simulate features and devices communicating to and monitored by the simulated management controller;
execute, by the second VM instance in the first domain, the host simulator module to provide the simulated host computing device or the at least one simulated device connected to the simulated host computing device;
control, by the second VM instance in the first domain, the host simulator module to generate at least one output signal based on configuration data of the simulated host computing device or the simulated device connected to the simulated host computing device; and
send, by the second VM instance in the first domain, the at least one output signal to the firmware module executed at the first VM instance, such that the simulated management controller provided by the firmware module executed at the first VM instance is configured to receive the at least one output signal from the simulated host computing device or from the at least one simulated device connected to the simulated host computing device;
wherein the controller simulator module comprises:
a data store storing configuration data of the simulated host computing device and the at least one simulated device simulated by the controller simulator module; and
at least one simulator library sub-module, wherein each of the at least one simulator library sub-module is configured to simulate one of the simulated devices simulated by the controller simulator module by:
generating at least one additional output signal for the simulated management controller for the simulated one of the at least one simulated device simulated by the controller simulator module based on the configuration data stored in the data store.

12. The non-transitory computer readable medium as claimed in claim 11, wherein the host simulator module comprises:
a basic input/output system (BIOS) simulation module, configured to simulate a BIOS of the simulated host computing device; and
an interface simulation module, configured to simulate a plurality of interfaces of the simulated host computing device,
wherein the interfaces simulated by the interface simulation module comprise an Enhanced Host Controller Interface (EHCI) interface and a Low Pin Count (LPC) interface.

13. The non-transitory computer readable medium as claimed in claim 11, wherein the firmware module comprises a library module storing a plurality of library programs for the simulated host computing device and the at least one simulated device connected to the simulated host computing device, and
wherein each of the at least one simulator library sub-module is further configured to:
receive a command from one of the library programs of the library module, wherein the at least one additional output signal is generated as a response to the command for the at least one simulated device based on the configuration data stored in the data store; and
send the response to the library module.

14. The non-transitory computer readable medium as claimed in claim 13, wherein the controller simulator module further comprises:
at least one simulator driver sub-module, each configured to simulate one of the at least one simulated device controlled by a driver by:
receiving a command from the driver;
generating the at least one output signal as a response to the command for the at least one device based on the configuration data stored in the data library; and
sending the response to the driver.

\* \* \* \* \*